(12) United States Patent
Kitano et al.

(10) Patent No.: US 6,695,922 B2  
(45) Date of Patent: Feb. 24, 2004

(54) FILM FORMING UNIT

(75) Inventors: Takahiro Kitano, Kikuyo-Machi (JP); Shinji Kobayashi, Kikuyo-Machi (JP); Yukihiko Esaki, Kikuyo-Machi (JP); Masateru Morikawa, Kikuyo-Machi (JP)

(73) Assignee: Tokyo Electron Limited, Tokyo (JP)

(*) Notice: Subject to any disclaimer, the term of this patent is extended or adjusted under 35 U.S.C. 154(b) by 206 days.

(21) Appl. No.: 09/734,571

(22) Filed: Dec. 13, 2000

(65) Prior Publication Data

US 2002/0124797 A1 Sep. 12, 2002

(30) Foreign Application Priority Data

Dec. 15, 1999 (JP) .......................... 11-356399

(51) Int. Cl.$^7$ .............................................. B05C 11/10
(52) U.S. Cl. ........................ 118/667; 118/666; 118/56; 118/59; 118/315
(58) Field of Search .............................. 118/52, 56, 320, 118/321, 323, 666, 667, 712, 58, 59, 66, 69, 301, 504, 101, 72, 107, 305, 315; 427/240, 425; 219/634, 650

(56) References Cited

U.S. PATENT DOCUMENTS

| | | | |
|---|---|---|---|
| 5,127,362 A | | 7/1992 | Iwatsu et al. |
| 5,456,945 A | * | 10/1995 | McMillan et al. .......... 427/252 |
| 5,580,607 A | | 12/1996 | Takekuma et al. |
| 5,776,545 A | * | 7/1998 | Yoshiba et al. ............. 427/356 |
| 5,993,547 A | * | 11/1999 | Sato .......................... 118/56 |
| 6,002,108 A | * | 12/1999 | Yoshioka .................... 219/388 |
| 6,033,480 A | * | 3/2000 | Chen et al. ................. 118/715 |
| 6,072,162 A | * | 6/2000 | Ito et al. ................... 219/444.1 |
| 6,113,697 A | * | 9/2000 | Kim et al. .................. 118/712 |
| 6,306,455 B1 | * | 10/2001 | Takamori et al. ............ 118/52 |

FOREIGN PATENT DOCUMENTS

JP  2000-077326  3/2000

* cited by examiner

Primary Examiner—Richard Crispino  
Assistant Examiner—George R Koch, III  
(74) Attorney, Agent, or Firm—Rader, Fishman & Grauer PLLC

(57) ABSTRACT

The present invention is a film forming unit for applying a coating solution to a substrate to form a coating film on the substrate, which has a heating and/or cooling member brought into direct or indirect contact with said substrate for changing a temperature of at least a peripheral portion of the substrate. By changing the temperature of a perimeter portion of the substrate by means of it, a temperature of the coating solution applied on the substrate can be changed. Consequently, surface tension of the coating solution decreases or increases, and swelling of the coating solution occurring at the substrate perimeter portion and reduction in film thickness can be prevented. As a result, a coating film with a predetermined film thickness is formed also on the perimeter portion of the substrate, thus making it possible to enhance yield.

11 Claims, 15 Drawing Sheets

FILM FORMING UNIT

BACKGROUND OF THE INVENTION

1. Field of the Invention

The present invention relates to a film forming unit for a substrate.

2. Description of the Related Art

In the photolithography process in semiconductor device fabrication, for example, resist coating treatment for applying a resist solution to the top surface of a wafer to form a resist film, exposure processing for exposing a pattern on the wafer, developing processing for developing the exposed wafer, and the like are performed to form a predetermined circuit pattern on the wafer.

At present, a spin coating method is in the mainstream as a method of applying a resist solution in the above-described resist coating treatment. According to the spin coating method, the resist solution is discharged to the center of the wafer and the wafer is rotated. This allows the resist solution applied on the wafer to spread by centrifugal force, whereby a uniform resist film can be formed over the entire face of the wafer.

However, in the spin coating method, the wafer is rotated at high speed, whereby a large amount of resist solution scatters from the peripheral portion of the wafer, which results in a big waste of resist solution. Moreover, the unit is contaminated by the scatter of the resist solution, thereby causing adverse effects such as necessity for frequent cleaning.

Therefore, instead of the spin coating method in which the wafer is rotated, a method, in which a nozzle for discharging the resist solution and the wafer are moved relatively to each other to apply the resist solution having low viscosity evenly on the wafer, for example, in a lattice form, is conceivable.

However, also in such a method of applying the resist solution in the manner of a so-called single stroke, there is a fear that a resist film is not uniformly formed since the resist solution applied at the peripheral portion of the wafer swelled by surface tension. Even if exposure is performed with the resist film swelled at the peripheral portion, the swelled peripheral portion becomes a defective portion that can not be used as a product, thereby decreasing yield correspondingly.

SUMMARY OF THE INVENTION

The present invention is made in view of the aforesaid points, and its object is to provide a film forming unit for a substrate which forms various kinds of coating films including a resist film having predetermined thickness even at a perimeter portion of the substrate.

In order to attain the above object, according to a first aspect of the present invention, the invention is a film forming unit for applying a coating solution to a substrate and forming a coating film on the substrate, having a heating and/or cooling member brought into direct or indirect contact with the aforesaid substrate for changing temperature of at least a peripheral portion of the aforesaid substrate.

Further, according to a second aspect of the present invention, the invention is a film forming unit for applying a coating solution to a substrate and forming a coating film on the substrate, having a solvent supply device for supplying mist or vapor of a solvent for the aforesaid coating solution to at least a perimeter portion of the aforesaid substrate By bringing the aforesaid heating and/or cooling member into contact with the substrate and changing the temperature of at least the perimeter portion of the substrate, the temperature of the coating solution applied at least on the perimeter portion of the aforesaid substrate is changed, and thus the surface tension of the coating solution is changed. As a result, at the perimeter portion of the substrate, swelling caused by the surface tension and reduction in film thickness are prevented, whereby a coating film with a predetermined thickness is also formed on the perimeter portion of the substrate. It should be noted that the contact mentioned here is not limited to the expression of the situation in which the substrate and the heating and/or cooling member are joined, but it is also used as a meaning including the situation in which they are close to each other to the extent that the heat of the heating and/or cooling member exerts an influence on the substrate.

Further, by supplying mist or vapor of the solvent to the perimeter portion of the substrate, the tension force of the coating solution applied to the perimeter portion of the substrate can be decreased. Accordingly, on the perimeter portion of the substrate, swelling of the coating solution due to the surface tension can be reduced.

It is preferable that a coating solution discharge portion moving relatively to the aforesaid substrate and discharging the coating solution to the aforesaid substrate is included and that the coating solution discharge portion is made movable relatively to the aforesaid substrate while discharging the coating solution to a top surface of the aforesaid substrate.

It is preferable that the aforesaid heating and/or cooling member has a temperature changing element for controlling the aforesaid heating and/or cooling member at a predetermined temperature. The temperature changing element mentioned here is suitable if it has at least a temperature increasing function when the aforesaid heating and/or cooling member has only a heating function, and it is suitable if it has at least a temperature reducing function when the aforesaid heating and/or cooling member has only a cooling function.

The aforesaid heating and/or cooling member may be provided at a mounting table on which the substrate is placed. The aforesaid heating and/or cooling member may be formed into a ring shape corresponding to a shape of the perimeter portion of the aforesaid substrate, and is allowed to be in contact with an underside surface of the aforesaid substrate. The ring shape mentioned here corresponds to the shape of the perimeter portion of the substrate. Therefore, if the substrate is a square, the outer shape of the aforesaid heating and/or cooling member is a quadrangle, and if the substrate is circular, the outer shape is circular. The aforesaid heating and/or cooling member may be vertically movable. By making it vertically movable, the timing of changing the temperature of the perimeter portion of the substrate and the temperature of the substrate can be controlled.

If the aforesaid heating and/or cooling member has the aforesaid temperature changing element for each divided region and is structured so that a temperature for each region is controllable, different temperatures are set for the respective regions and the temperatures can be controlled. Accordingly, it can be applied to the situation in which the degree of change in the coating solution occurring at the perimeter portion of the substrate differs according to the areas.

Further, it is possible to provide a cooling member for reducing the temperature of the aforesaid substrate inside the aforesaid heating and/or cooling member, and it is also possible to further provide a heating member for heating the aforesaid substrate inside the aforesaid cooling member.

DETAILED DESCRIPTION OF THE PREFERRED EMBODIMENTS

Figure 1:
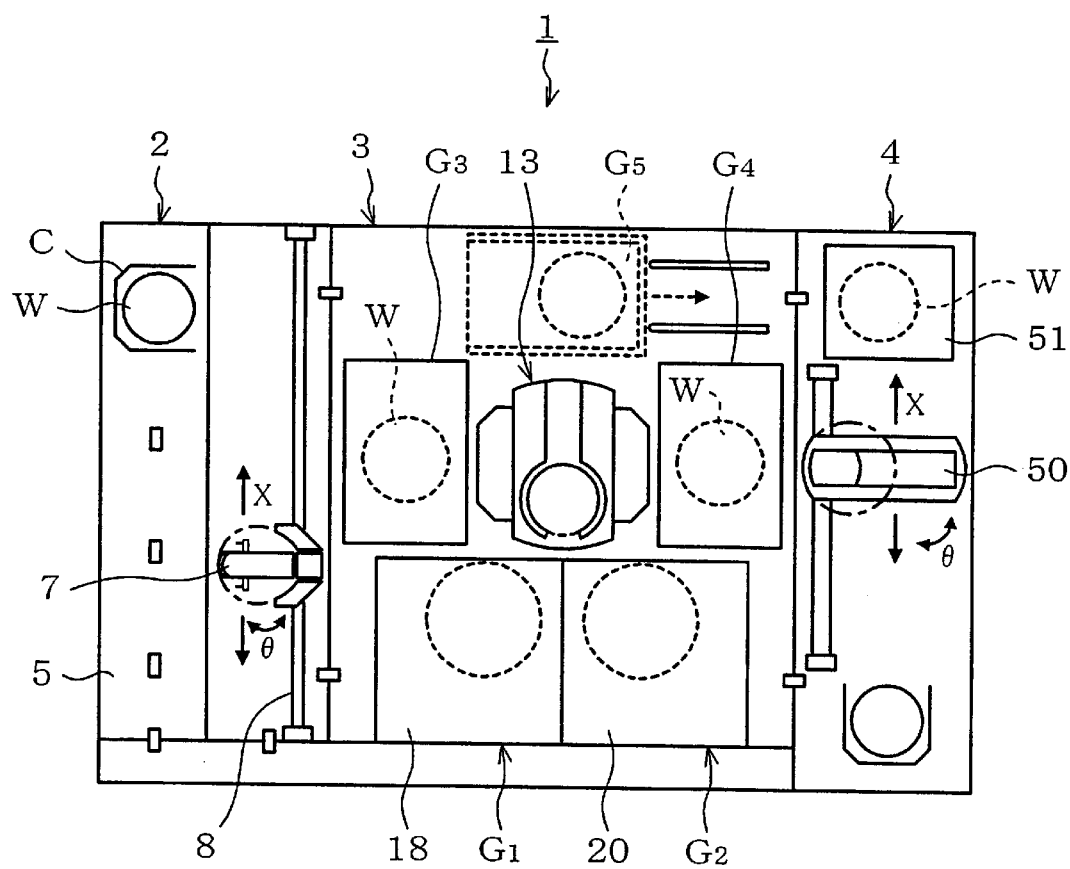
FIG. 1 is a plane view showing an appearance of a coating and developing system having a resist coating unit according to an embodiment.
Figure 2:
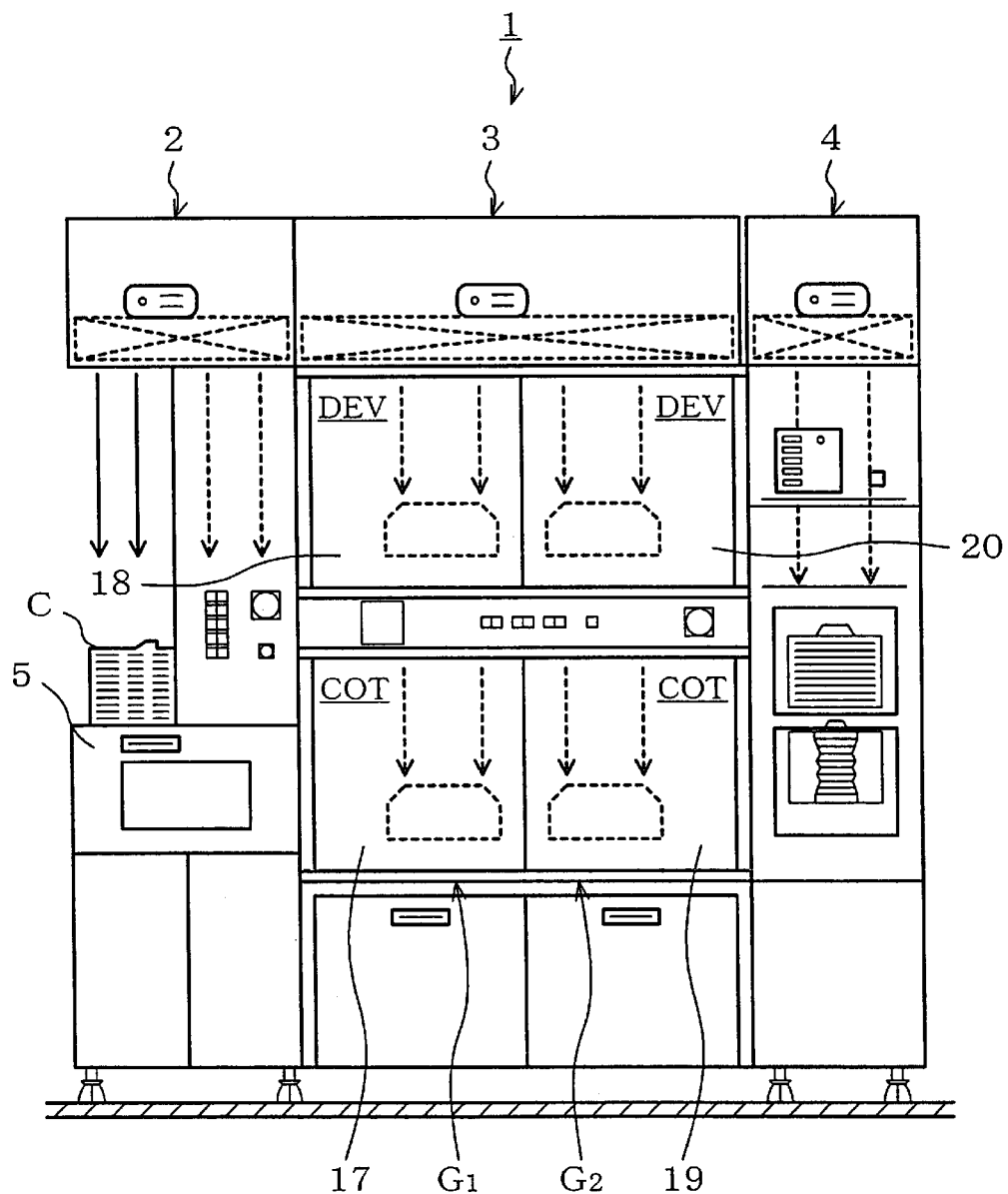
FIG. 2 is a front view of the coating and developing system in FIG. 1.
Figure 3:
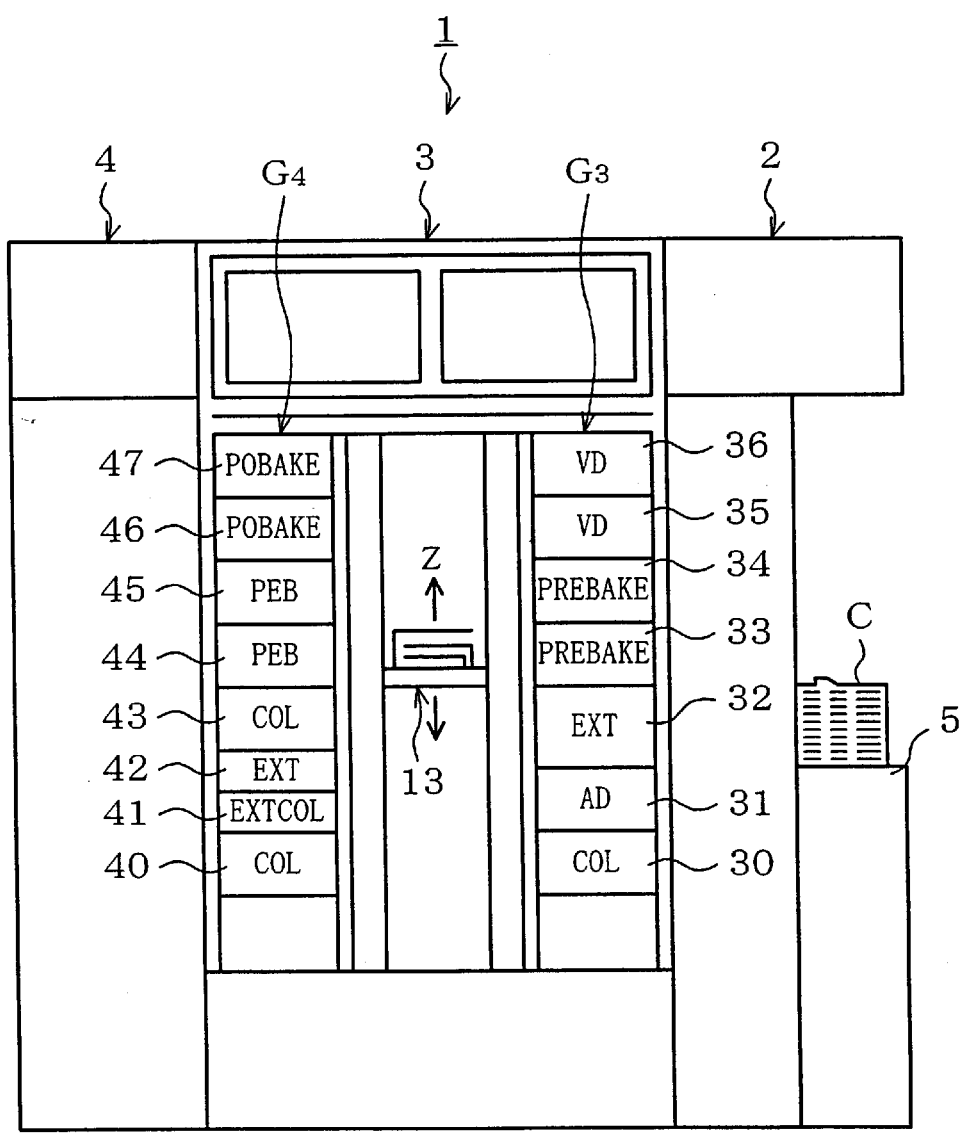
FIG. 3 is a rear view of the coating and developing system in FIG. 1.

Preferred embodiments of the present invention will be described hereinafter. FIG. 1 is a plane view of a coating and developing system 1 having a resist coating unit according to the present embodiments, FIG. 2 is a front view of the coating and developing system 1, and FIG. 3 is a rear view of the coating and developing system 1.

As shown in FIG. 1, the coating and developing system 1 has a structure in which a cassette station 2 for carrying, for example, 25 wafers W from/to the outside to/from the coating and developing system 1 in the unit of cassette and for carrying the wafers W into/from a cassette C, a processing station 3 in which various kinds of multi-tiered processing units for performing predetermined processing one by one in the coating and developing process are disposed, and an interface section 4 for receiving and delivering the wafer W from/to an aligner which is not shown provided adjacent to the processing station 3, are integrally connected.

In the cassette station 2, a plurality of cassettes C are mountable at predetermined positions on a cassette mounting table 5 serving as a mounting section in a line in an X-direction (the vertical direction in FIG. 1). Further, a wafer carrier 7, which is transferable in the direction of alignment of the cassettes (the X-direction) and in the direction of alignment of the wafers W housed in the cassette C (a Z-direction; a vertical direction), is provided to be movable along a carrier path 8 and is selectively accessible to the respective cassettes C.

The wafer carrier 7 has an alignment function for aligning the wafer W. The wafer carrier 7 is structured so as to be also accessible to an extension unit 32 included in a third processing unit group G3 on the side of the processing station 3 as will be described later.

In the processing station 3, a main carrier unit 13 is provided in a center part thereof, and various kinds of processing units are multi-tiered on the periphery of the main carrier unit 13 to compose processing unit groups. In the coating and developing system 1, there are four processing unit groups G1, G2, G3 and G4, and the first and the second processing unit groups G1 and G2 are disposed on the front side of the coating and developing system 1, the third processing unit group G3 is disposed adjacently to the cassette station 2, and the fourth processing unit group G4 is disposed adjacently to the interface section 4. Further, as an option, a fifth processing unit group G5 depicted by the broken lines can be additionally arranged on the rear side of the coating and developing system 1.

In the first processing unit group G1, a resist coating unit 17 according to the present embodiment and a developing unit 18 for performing treatment on the wafer W with a developing solution supplied are two-tiered in the order from the bottom as shown in FIG. 2. As for the second processing unit group G2, a resist coating unit 19 and a developing unit 20 are similarly two-tiered in the order from the bottom.

In the third processing unit group G3, for example, as shown in FIG. 3, a cooling unit 30 for cooling the wafer W, an adhesion unit 31 for performing solution processing for increasing the fixability between a resist solution and the wafer W, the extension unit 32 for keeping the wafer W waiting, prebaking units 33 and 34 for heating a solvent in the resist solution to dry the same, reduced-pressure drying units 35 and 36 for reducing pressure to dry the solvent in the resist solution and so on are, for example, seven-tiered in the order from the bottom.

In the fourth processing unit group G4, for example, a cooling unit 40, an extension and cooling unit 41 for spontaneously cooling the placed wafer W, an extension unit 42, a cooling unit 43, post-exposure baking units 44 and 45 for performing heat treatment after exposure processing, postbaking units 46 and 47 and so on are, for example, eight-tiered in the order from the bottom.

In the center part of the interface section 4, provided is a wafer carrier 50. The wafer carrier 50 is structured so as to be movable in the X-direction (the vertical direction in FIG. 1) and the Z-direction (the vertical direction), and to be rotatable in a θ direction (a rotational direction about an axis Z), so that it can access the extension and cooling unit 41, the extension unit 42 which are included in the fourth processing unit group G4, a peripheral aligner 51, and an aligner which is not shown.

Figure 4:
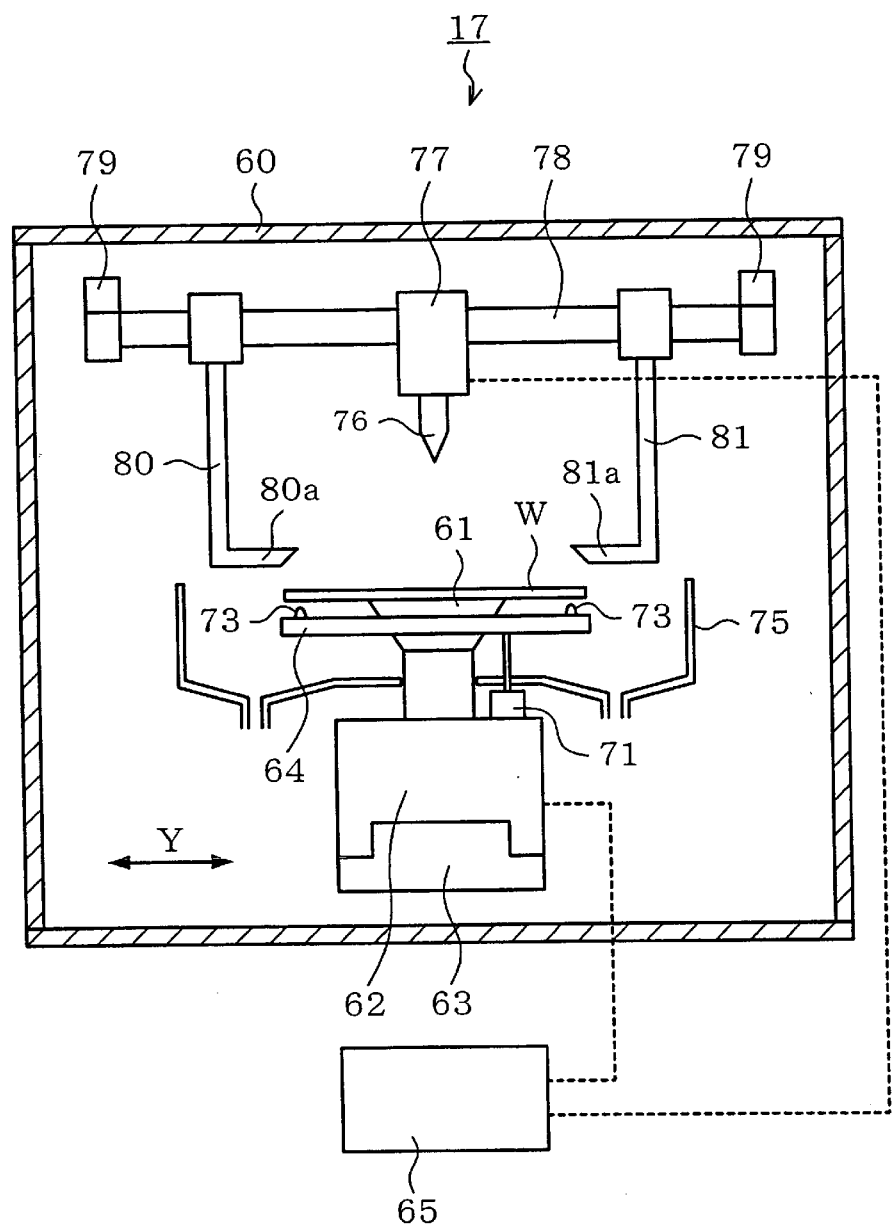
FIG. 4 is an explanatory view of a vertical cross section of a resist coating unit according to a first embodiment.
Figure 5:
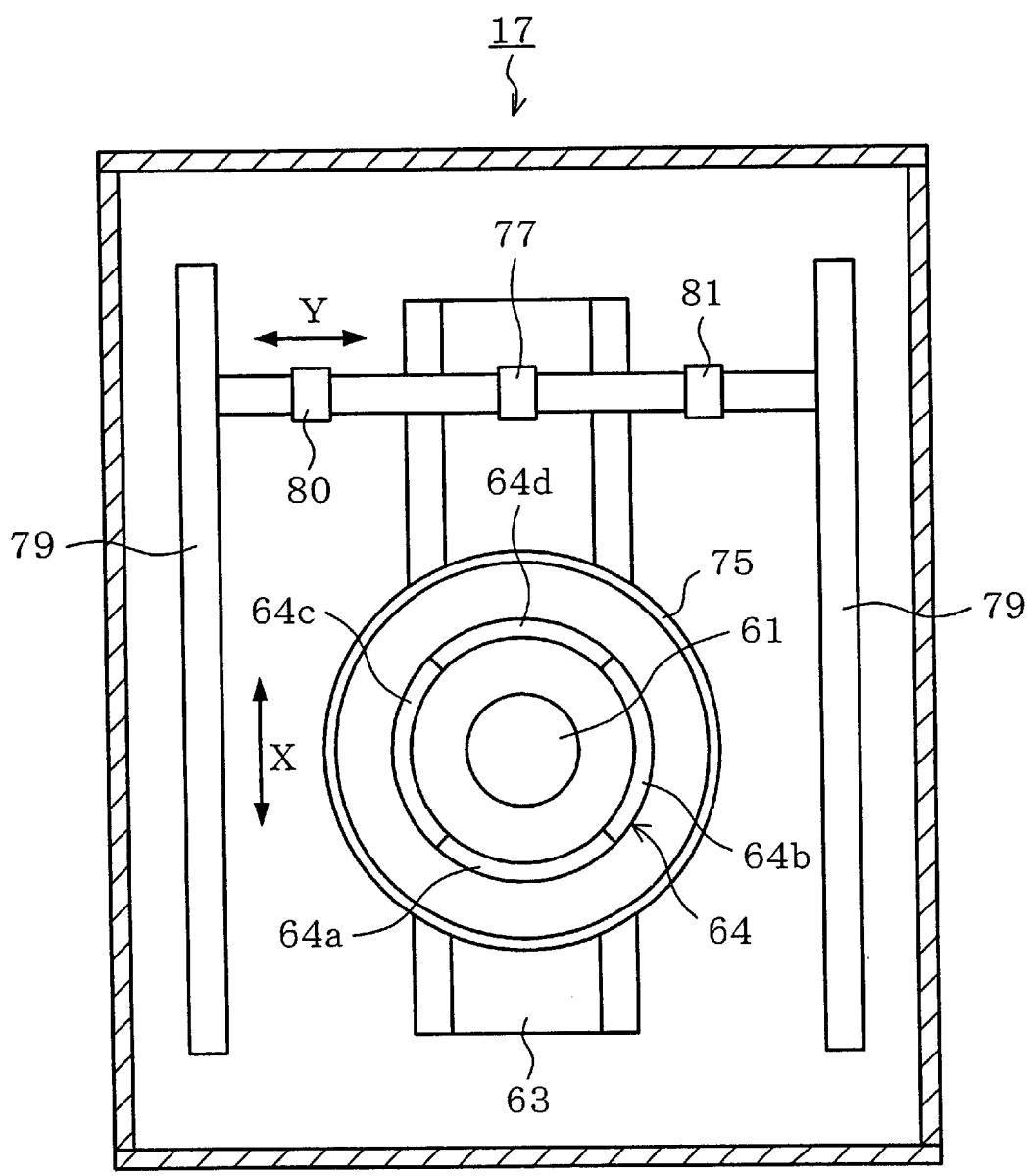
FIG. 5 is an explanatory view of a horizontal cross section of the resist coating unit according to the first embodiment.

A structure of the above-described resist coating unit 17 will be explained in detail. First, as shown in FIG. 4 and FIG. 5, a mounting table 61 for holding the wafer W under treatment by suction is provided inside a casing 60. A drive mechanism 62 for the mounting table 61 is provided under the mounting table 61. A motor or the like for making the mounting table 61 movable in a vertical and a rotational direction is incorporated in the drive mechanism 62. Accordingly, the wafer W on the mounting table 61 can be raised and lowered when it is carried in and out, and can be rotated when alignment is performed by the drive mechanism 62.

As shown in FIG. 5, the drive mechanism 62 itself is provided on a rail 63 disposed in the X direction (the vertical direction in FIG. 5), and is movable in the X direction by a drive mechanism not illustrated which is controlled by a main controller 65. Thus, following the movement of the drive mechanism 62, the mounting table 61 as well as the wafer W on the mounting table 61 moves in the X direction. Consequently, by controlling the movement of the drive mechanism 62 itself in the X direction by the main controller 65, the movement of the wafer W in the X direction is precisely controlled.

A heating and/or cooling member 64 for heating and/or cooling a peripheral portion of the wafer W is attached in such a manner as to surround the mounting table 61. The heating and/or cooling member 64 is formed into a ring shape correspondingly to the shape of a peripheral portion of the wafer W, and is provided so as to be located beneath the peripheral portion of the wafer W.

Figure 6:
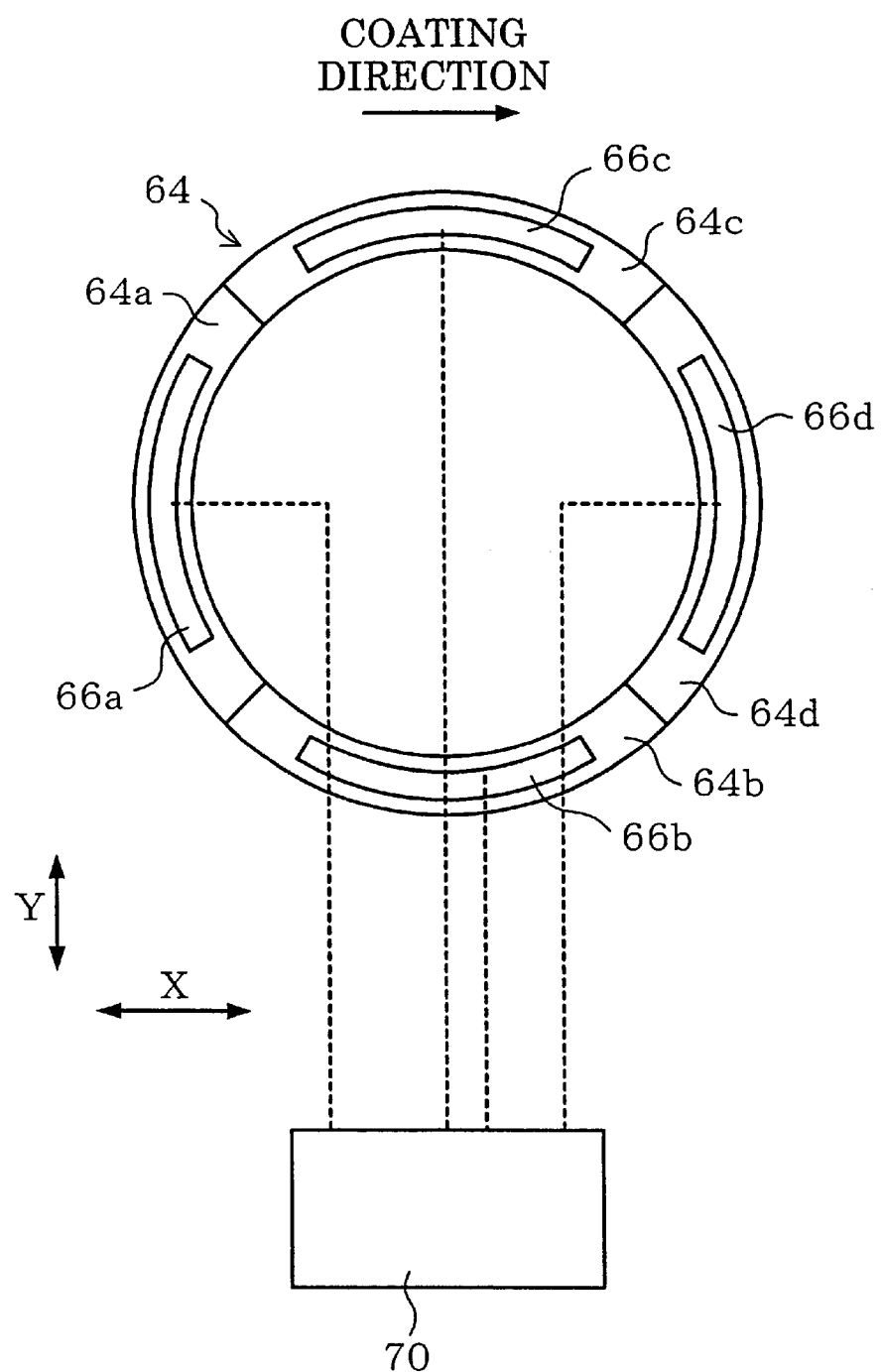
FIG. 6 is an explanatory view of a heating and/or cooling member for heating a wafer in the resist coating unit according to the first embodiment.

The heating and/or cooling member 64 is divided into four regions 64a, 64b, 64c, and 64d so that each shape is, for example, in a circular arc form as shown in FIG. 6. Peltier elements 66a, 66b, 66c, and 66d as temperature changing elements being a heating and cooling source of the heating and/or cooling member 64 are individually incorporated in the respective regions of the heating and/or cooling member 64. The temperatures of the Peltier elements 66a, 66b, 66c and 66d are controlled by a temperature controller 70 in accordance with the respective regions. Accordingly, the temperatures of the heating and/or cooling member 64 can be maintained at temperatures set at the temperature controller 70, for example, the region 64a can be maintained at 26° C., the regions 64b and 64c at 24° C., and the region 64d at 22° C.

A heating and/or cooling member drive device 71 for vertically driving the heating and/or cooling member 64 is provided on the driving mechanism 62 under the heating and/or cooling member 64. Thereby, the heating and/or cooling member 64 is movable, and thus it can rise in a predetermined timing to be in contact with the wafer W peripheral portion to thereby heat or cool the wafer W.

Further, proximity pins 73, for example, 0.1 mm high are attached at a top surface of the heating and/or cooling member 64 as an abutting member. The proximity pin 73 prevents direct contact of the wafer W and the heating and/or cooling member 64, and radiation heat of the heating and/or cooling member 64 heats the wafer W.

At the mounting table 61, attached is a cup 75 for surrounding a side portion and a bottom portion of the mounting table 61 and recovering the resist solution dropped from the wafer W.

As shown in FIG. 4, a nozzle 76 as a coating solution discharge portion for supplying the resist solution to the wafer W is provided above the mounting table 61. The nozzle 76 is held by a holding member 77, and the holding member 77 is movable on a rail 78 disposed in a Y direction (left and right direction in FIG. 4). Further, the rail 78 is provided to be movable on two rails 79 disposed in the X direction along both side walls of the casing 60. The rail 78 and the holding member 77 are driven by a drive device not shown, and the operation is controlled by the main controller 65. As a result, the speed, the timing of the operation and the like of the nozzle 76 are controlled by the main controller 65, and is movable in the X and Y direction. Accordingly, the nozzle 76 and the wafer W on the mounting table 61 can move relatively to each other, and it is possible to apply the resist solution onto the wafer W in the manner of a so-called one stroke.

Two mask members 80 and 81 for preventing the resist solution from dropping outside the wafer W are suspended from the above rail 78 to be movable with the aforesaid nozzle 76 between them. These two mask members 80 and 81 extend downward from the rail 78, and are bent inside so as to face each other at a position above the wafer W placed on the mounting table 61 so as to have horizontal portions 80a and 81a. These horizontal portions 80a and 81a have the sections formed into a concave shape so that they receive the dropping resist solution to prevent the resist solution from scattering around.

The movement of the two mask members 80 and 81 on the rail 78 is controlled so that they are always located above both end portions of the wafer W, following the movement of the mounting table 61 loaded with the wafer W in the X direction. Accordingly, the mask members 80 and 81 are located above the both end portions of the wafer W in the same X coordinate as the nozzle 76, and provide blockage with the aforesaid horizontal portions 80a and 81a to receive the resist solution discharged outside the wafer W from the nozzle 76 thereon, which continues discharge operation while moving, thereby preventing contamination inside the casing 60.

The operation of the resist coating unit 17 as structured above will be described together with a photolithography process performed in the coating and developing system 1.

First, the wafer carrier 7 takes an unprocessed wafer W out of the cassette C to carry it into the adhesion unit 31 included in the third processing unit group G3. Then the wafer W, which is coated with an adhesion reinforcing agent such as HMDS for reinforcing adhesion of the resist solution therein, is carried to the cooling unit 30 by the main carrier unit 13 and cooled to a predetermined temperature. Thereafter, the wafer W is carried to the resist coating unit 17 or 19 according to the present embodiment.

The structure of the resist coating unit 17 explained above makes it possible to apply the resist solution in the manner of a so-called single stroke in which the resist solution is applied onto the wafer W from the nozzle 76 while moving the nozzle 76 and the wafer W relatively to each other.

Figure 7:
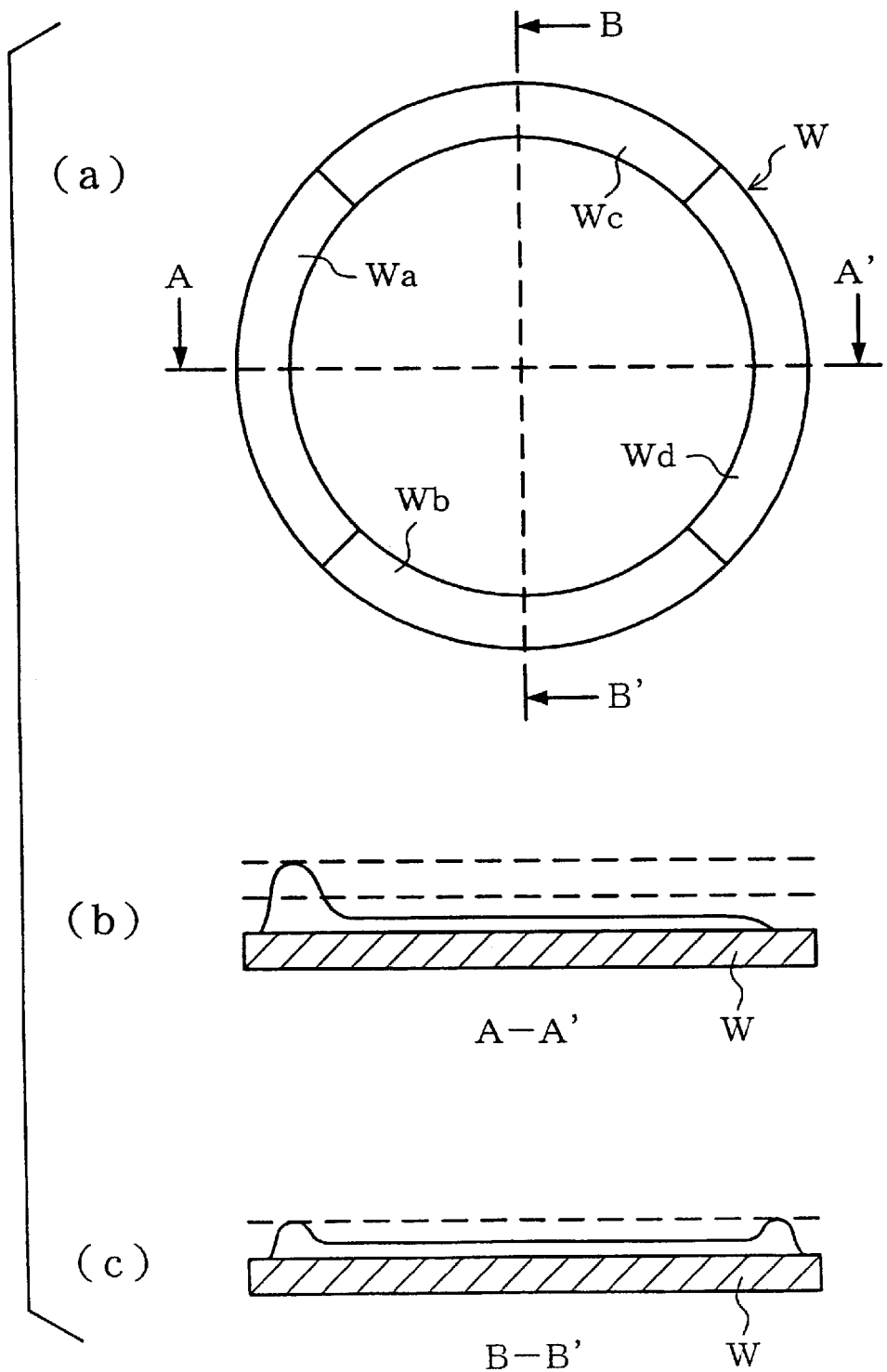
FIG. 7(a), FIG. 7(b), and FIG. 7(c) are explanatory views showing swelling at a wafer peripheral portion occurring when a resist solution is applied onto the wafer.

According to the knowledge of the inventor, when the resist solution is applied in the manner of a so-called single stroke, if any action is not taken, swelling of the resist solution occurs at the wafer W peripheral portion. As shown in FIG. 7(a), FIG. 7(b), and FIG. 7(c), it is conceivable that the aforesaid swelling at the portion coated earlier is large, and at the portions coated later, swellings are smaller in order. At the portion coated finally, swelling does not exist at all in some cases, and the film thickness reduces. Accordingly, it is basically conceivable that the film thickness of the resist solution is larger in the order of a portion Wa, at a portion Wb or Wc, and at a portion Wd.

Then, before the resist solution coating treatment is started, at the temperature controller 70, temperatures are set for the respective regions 64a, 64b, 64c and 64d of the heating and/or cooling member 64 corresponding to the respective portions Wa, Wb, Wc and Wd of the wafer W so that they are gradually lower in the order being coated. In this embodiment, the region 64a is set at 26° C., the region 64b and the region 64c are set at 24° C., and the region 64d is set at 22° C. The regions 64a, 64b, 64c and 64d of the heating and/or cooling member 64 are previously heated and cooled to the respective set temperatures by the Peltier elements 66a, 66b, 66c and 66d. It is noted that the coating and developing system 1 itself is controlled so that the inside of the casing 60 is at 23° C. which is the coating temperature of the resist solution.

Subsequently, the wafer W after pretreatment is carried into the resist coating unit 17 by the main carrier 13. The wafer W is suction-held by the mounting table 61 previously raised by the drive mechanism 62 and waiting, and is lowered by the drive mechanism 62 to stop at a predetermined position inside the cup 75. Thereafter, the wafer W is rotated by the drive mechanism 62, so that a notch portion and an orientation flat portion are detected by an optical sensor not illustrated, and the wafer W is aligned with a predetermined position.

Figure 8:
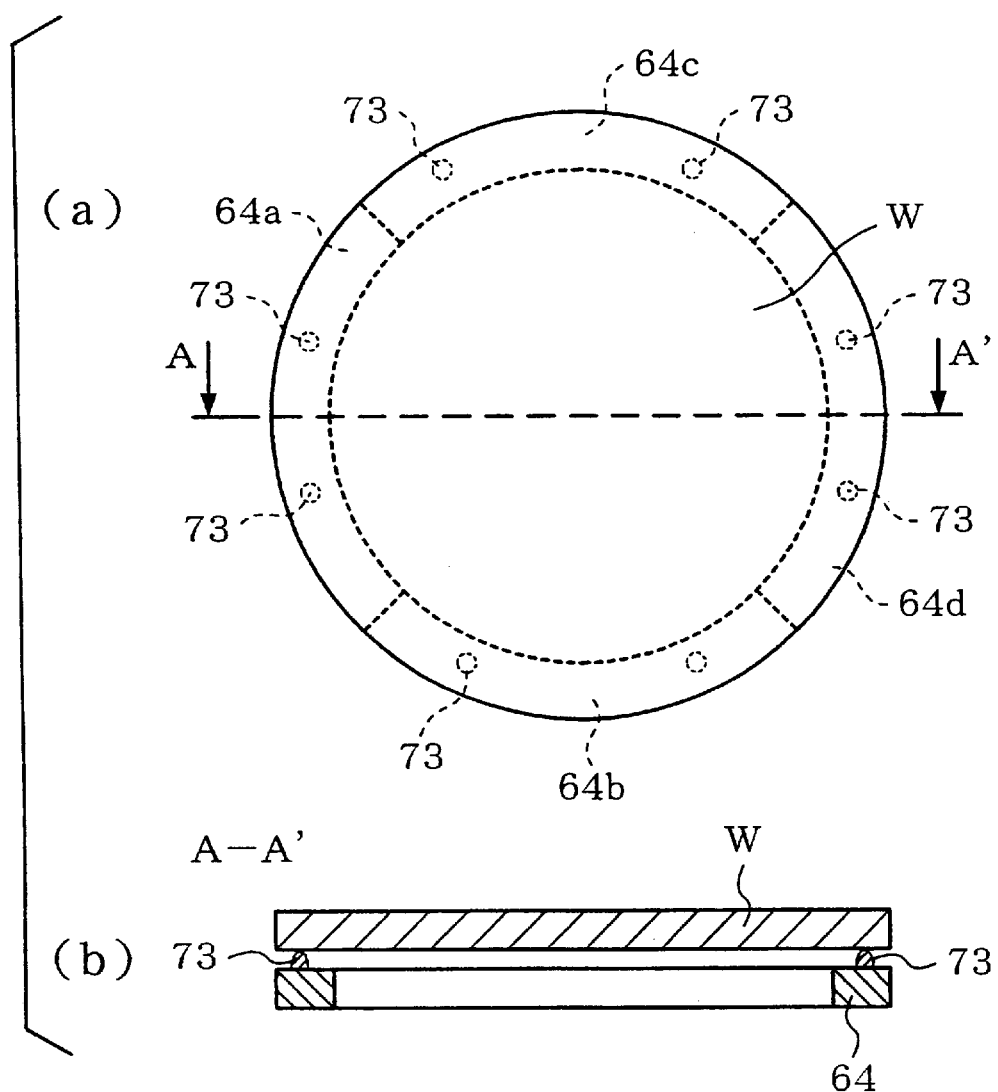
FIG. 8(a) and FIG. 8(b) are explanatory views showing the state in which the heating and/or cooling member heats the wafer.

Next, as shown in FIG. 8(a) and FIG. 8(b), the heating and/or cooling member 64 is raised by the heating and/or cooling member drive mechanism 71, and the proximity pins 73 are in contact with the underside surface of the wafer W peripheral portion. The wafer W peripheral portion is changed in temperature to be heated and cooled by radiation heat of the heating and/or cooling member 64, and the respective portions Wa, Wb, Wc and Wd of the wafer W corresponding to the respective regions 64a, 64b, 64c and 64d of the heating and/or cooling member 64 are heated and cooled to the respective temperatures (26° C., 24° C., 24° C., and 22° C. in order).

Figure 9:
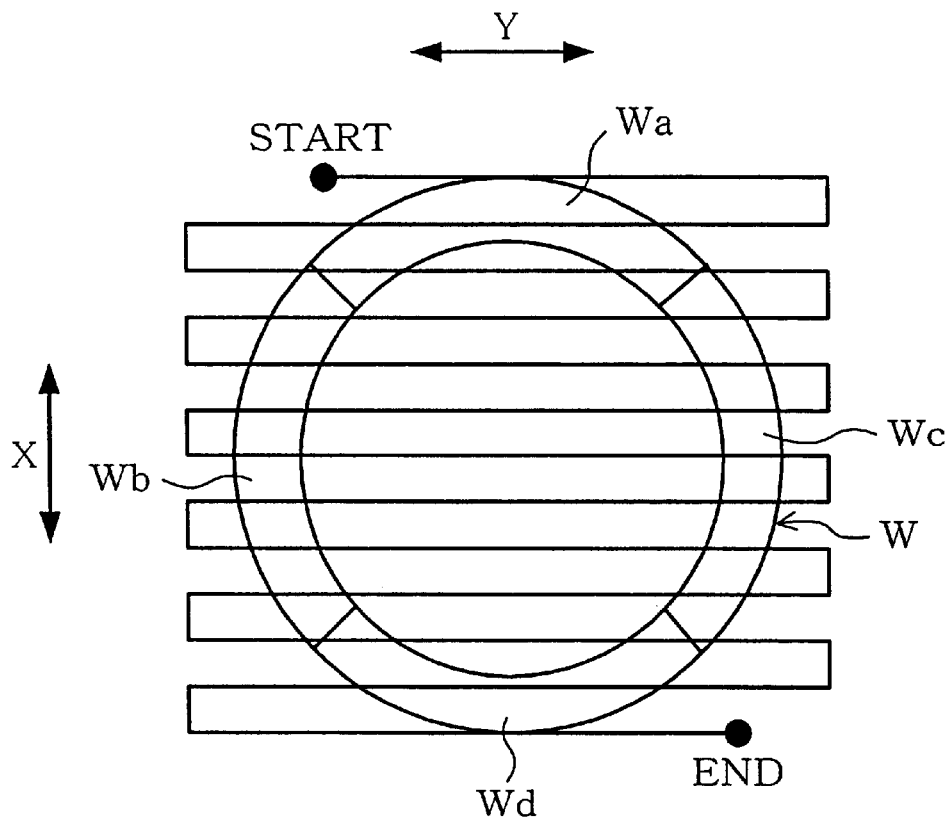
FIG. 9 is an explanatory view of a coating route of a nozzle for discharging the resist solution in the first embodiment.

Thereafter, the wafer W after the alignment moves on the rail 63 to a predetermined position by the main controller 65 to be on standby. Meanwhile, the nozzle 76 for discharging the resist solution normally moves along the rail 78 only in the Y direction and is on standby at a START point as shown in FIG. 9.

Thereafter, the discharge of a resist solution with relatively low viscosity to the wafer W is started. Initially, the nozzle 76 moves at a predetermined speed along the rail 78 extending in the Y direction while applying a fixed amount of the resist solution (for example, the amount which allows the discharged solution to have the diameter of 10 $\mu$m to 200 $\mu$m) onto the wafer W. When the nozzle 76 moves across the peripheral portion of the wafer W and reaches a position above the mask member 80, the nozzle 76 stops once. In this situation, the wafer W is sent in the X direction by the movement of the drive mechanism 62 itself to be displaced by a predetermined distance by the main controller 65. At this time, the mask member 80 is moved in the Y direction so that a tip end of the horizontal portion 80a is always located at a position above the wafer W, which is at a little inner side from an end portion of the wafer W. Then while the nozzle 76 is moved in the reverse direction, the resist solution is discharged.

When the nozzle 76 moves across the peripheral portion of the wafer W and reaches a position above the mask member 81, the nozzle 76 stops once. In this situation, the wafer W is sent in the X direction again by the main controller 65 and is displaced by the predetermined distance. At this time, the mask member 81 is moved in the Y direction so that a tip end of the horizontal portion 81a is always located at a position above the wafer W, which is at a little inner side from an end portion of the wafer W.

Thereafter, while the nozzle 76 is moved in the reverse direction once again, the resist solution is applied.

As described above, while the nozzle 76 is moved back and forth, it is stopped temporarily at the end portions for turn, and during that time, the wafer W is intermittently moved in the X direction, thereby applying the resist solution to the entire top surface of the wafer W as shown in FIG. 9.

Figure 10:
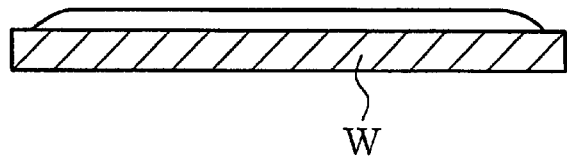
FIG. 10 is an explanatory view showing a state of the resist solution when the wafer peripheral portion is heated.

In this situation, the resist solution applied to the wafer W peripheral portion is heated and cooled at each temperature for each portion Wa, Wb, Wc, and Wd of the wafer W peripheral portion. As shown in FIG. 10, the surface tension of the resist solution decreases according to the heating temperature of each portion of the wafer W, and the resist solution has uniform thickness over the entire top surface of the wafer W.

Thereafter, the wafer W after the resist coating is raised by the drive mechanism 62 and is transferred to the main carrier 13 as when it is carried in. Subsequently, it is carried to the reduced-pressure drying unit 35 or 36, or to the prebaking unit 33 or 34 to be dried. Thereafter, a series of predetermined processing such as exposure processing, developing processing and the like is performed in each processing unit, whereby coating and developing processing is completed.

According to the above embodiment, by providing the heating and/or cooling member 64, the temperatures of the peripheral portion of the wafer W are changed to predetermined temperatures before the resist solution is applied, thereby making it possible to change the temperature of the resist solution applied thereafter. As a result, the surface tension of the resist solution applied to the wafer W peripheral portion can be decreased or increased, thus making it possible to prevent swelling of the resist solution at the wafer W peripheral portion, which is feared when the resist solution is applied in the manner of a so-called single stroke as described above, or reduction in the film thickness.

Further, in this embodiment, the temperature of the portion Wa which is coated earlier in the wafer W peripheral portion is set at a comparatively higher temperature (for example, 26° C.), and the temperature of the portion Wd which is coated later is set at a comparatively low temperature (for example, 22° C.). This is because of the knowledge of the inventor that swelling of the resist solution occurring at the portion coated earlier is larger than that occurring at the portion coated later, as described above. Accordingly, the surface tension is made smaller by increasing the temperature of the coating solution applied earlier while the surface tension is increased by reducing the temperature of the coating solution applied later to thereby achieve balance of film thickness between the peripheral portion and the other portions, whereby a predetermined resist film is formed over the entire top surface of the wafer W.

Accordingly, when it is not necessary, a heating and/or cooling member without divided regions may be used as the heating and/or cooling member 64 as described above, and in this case, swelling or the like of the resist solution at the wafer W peripheral portion described above can be similarly prevented.

Figure 11:
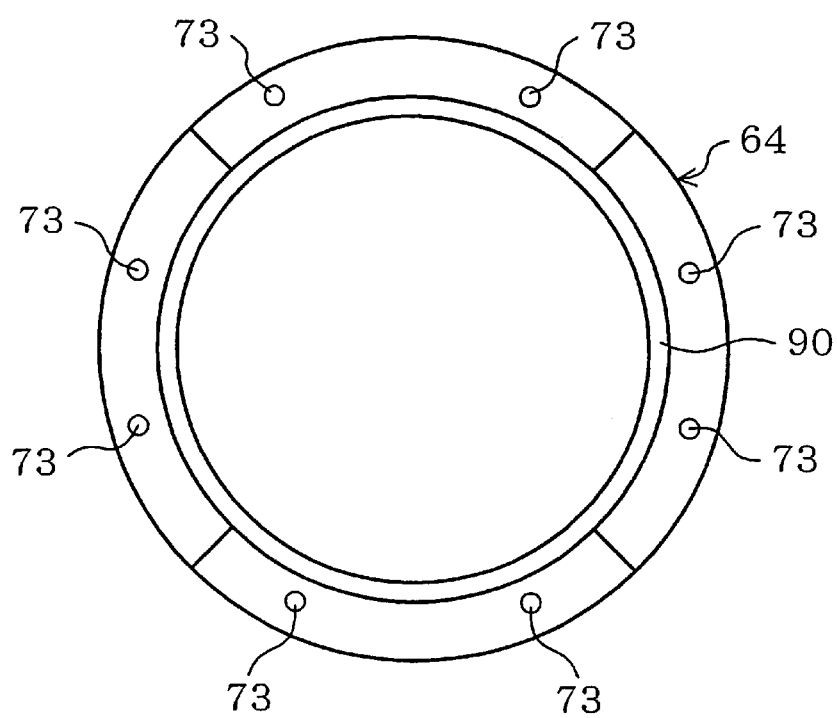
FIG. 11 is an explanatory view of the case in which a cooling member is provided inside the heating and/or cooling member.

Further, as shown in FIG. 11, a ring-shaped cooling member 90 may be provided inside the aforesaid heating and/or cooling member 64. A Peltier element, for example, is incorporated in the cooling member 90 as a cooling element, the temperature of which is controlled by the temperature controller 70. The set temperature in this situation is, for example, 22° C. in the aforesaid embodiment, and it is set at a lower temperature than that of the heating and/or cooling member 64 attached to the outer circumference thereof. This prevents the heat of the wafer W heated by the heating and/or cooling member 64 from being transmitted to the inside and changing the temperature of the portions other than the wafer W peripheral portion.

Figure 12:
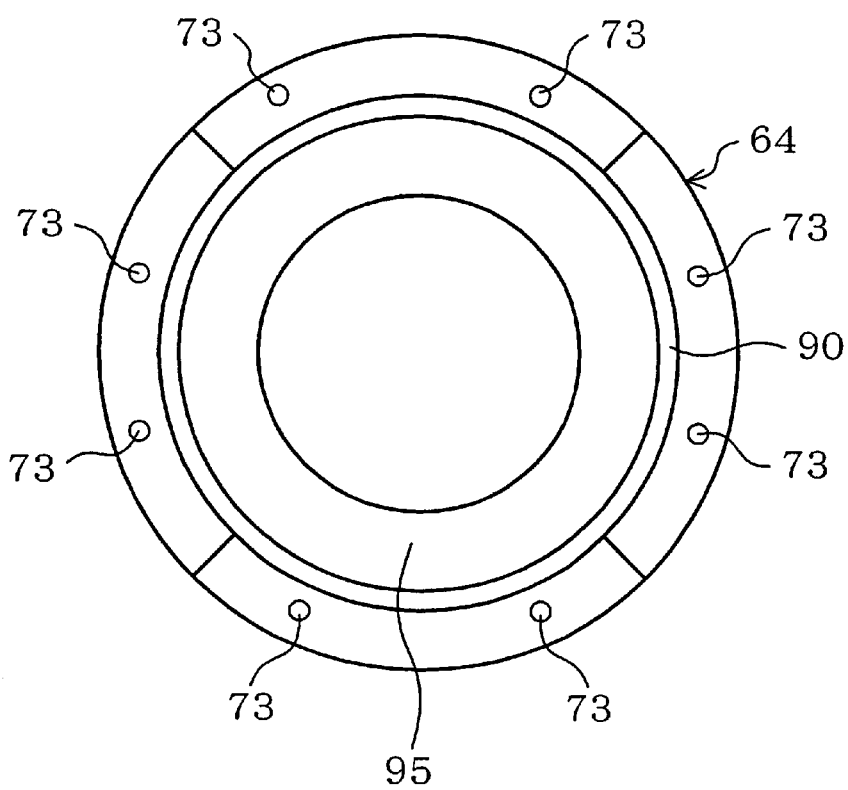
FIG. 12 is an explanatory view of the case in which a heating member is provided inside the cooling member.

Furthermore, a ring-shaped heating member 95 may be provided inside the cooling member 90 as shown in FIG. 12. The heating member 95 is set at a temperature at which the coating treatment is performed for the wafer W, for example, 23° C., and positively maintains the wafer W at a constant temperature so that the wafer W is not influenced by the heats of the aforesaid heating and/cooling member 64 and the cooling member 90. Thereby, coating treatment for the wafer W is properly performed and a predetermined resist film is formed.

The aforesaid heating and/or cooling member 64 has a heating and heat-absorbing member of which temperature control is easy. However, it may be suitable to run a tube through the heating and/or cooling member, for example, and pass temperature-controlled hot water, steam or the like through it.

Next, as a second embodiment, the resist coating unit 17 including the function of preventing swelling of a resist solution occurring at the aforesaid wafer W peripheral portion by supplying mist or vapor of a solvent to the wafer W peripheral portion will be explained.

Figure 13:
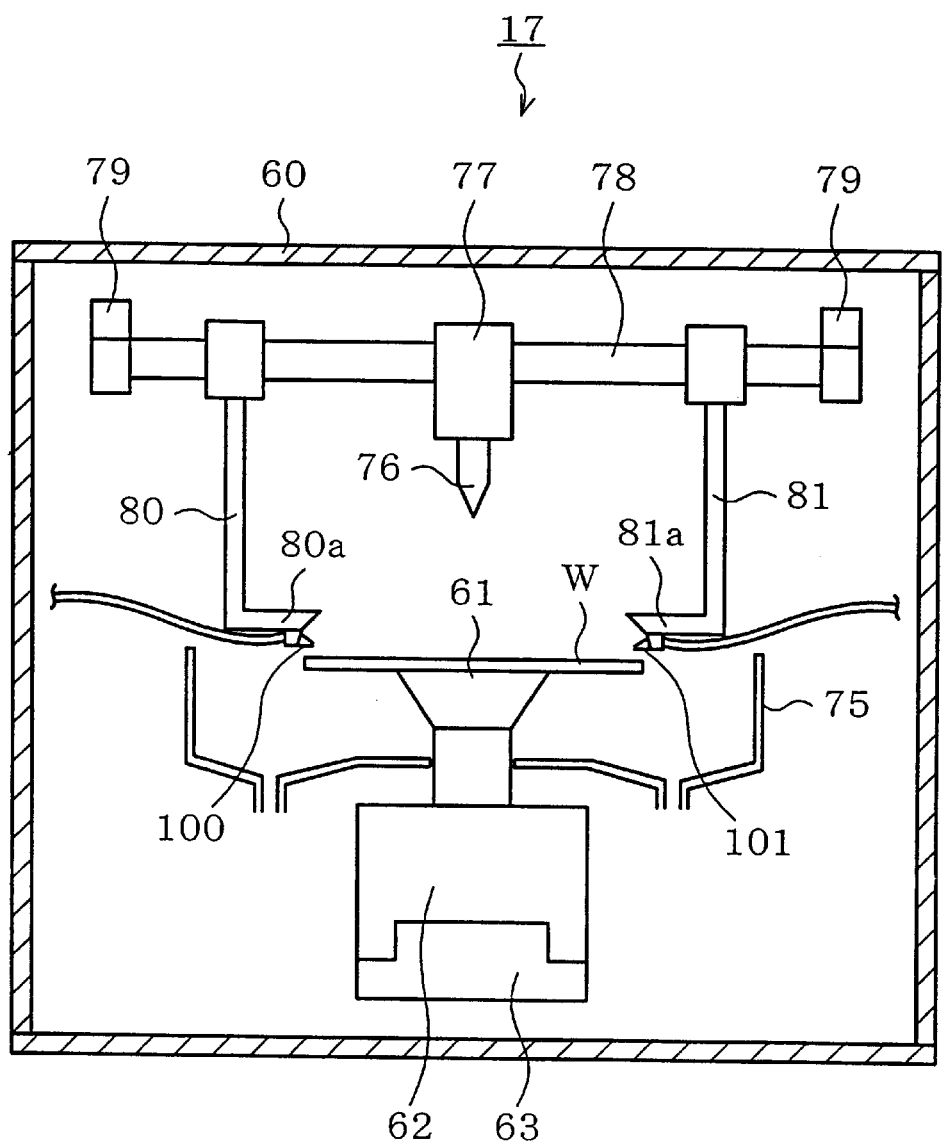
FIG. 13 is an explanatory view of a vertical cross section of a resist coating unit according to a second embodiment.
Figure 14:
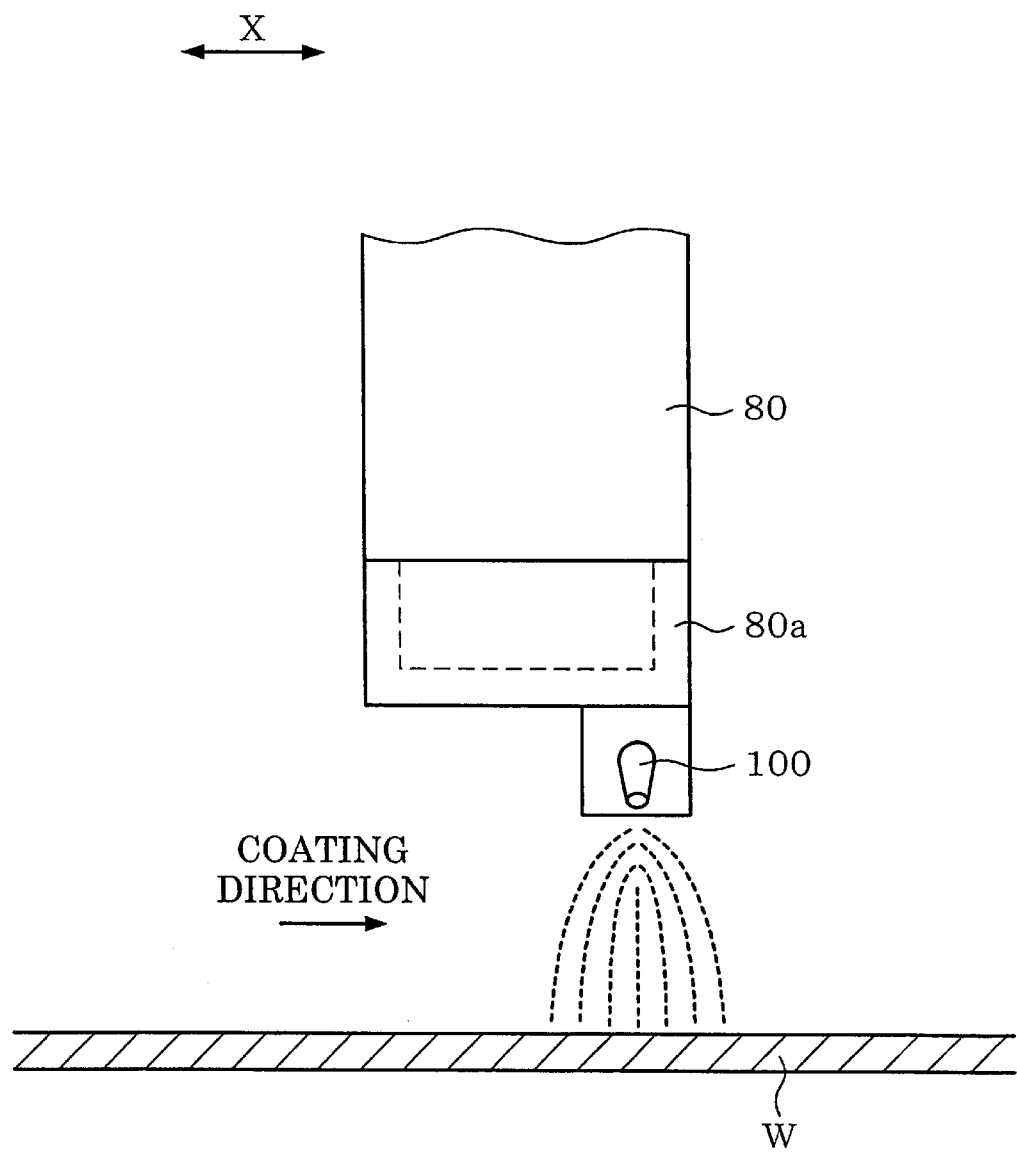
FIG. 14 is an explanatory view showing a position of a nozzle for supplying a solvent to a mask member of the resist coating unit.

As shown in FIG. 13, nozzles 100 and 101 as solvent supply means for supplying mist of a solvent for a resist solution to the wafer W peripheral portion are fixedly attached at underside surfaces of the horizontal portions 80a and 81a of the mask members. The nozzles 100 and 101 are communicated with a mist supply tank not illustrated and are structured to supply the mist onto the wafer W with a predetermined timing. The nozzles 100 and 101 are provided so as to be displaced to some extent from centers of the underside surfaces of the horizontal portions 80a and 81a of the mask members 80 and 81 in the direction in which the mask members 80 and 81 are moved (the X direction) at the time of applying the resist solution as shown in FIG. 14. Thereby, the solvent can be supplied to the wafer W peripheral portion just before the resist solution is applied. Since the tip end portions of the mask members 80 and 81 are controlled to be always located at the inner side from the end portions of the wafer W as described above, the solvent can be always supplied to the wafer W peripheral portion if the nozzles 100 and 101 are provided at the underside surfaces of the tip end portions of the mask members 80 and 81.

Figure 15:
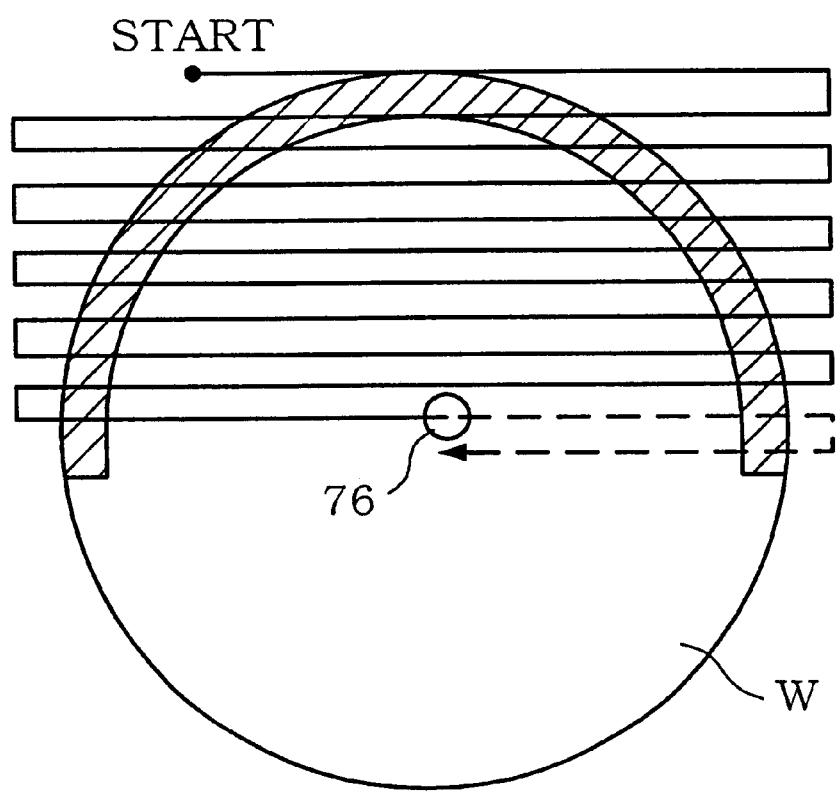
FIG. 15 is an explanatory view showing a supply range of the solvent supplied to a wafer perimeter portion.

In the operation as in the first embodiment, when the nozzle 76 moves above the wafer W in the Y direction while discharging the resist solution as shown in FIG. 15, the mist is supplied to the wafer W peripheral portion from the nozzles 100 and 101 when the nozzle 76 is located near the center of the wafer W (the diagonally shaded area in FIG. 15). As a result, the mist is already supplied to both ends of the wafer W peripheral portion on the route to be coated next when the nozzle 76 reaches the end portion for turn and is displaced in the X direction. Consequently, the mist is always supplied to the wafer W peripheral portion just before the resist solution is applied onto the wafer W.

According to the above second embodiment, by supplying the mist of the solvent to the wafer W peripheral portion before applying the resist solution thereto, the surface tension of the resist solution applied to the wafer W peripheral portion decreases thereafter, and swelling of the resist solution at the wafer W peripheral portion, which is feared when a resist solution with low viscosity is used, is prevented. In addition, by supplying the mist just before the resist solution is applied, the resist solution can be supplied before the mist is vaporized.

In the second embodiment, the nozzles 100 and 101 are fixedly provided at the mask members 80 and 81, but they may be fixedly provided at the nozzle 76, or they may be provided individually by being suspended from the rail 78, for example.

In the embodiments described above, only the heating and/or cooling member 64 is provided in the first embodiment while only the nozzles 100 and 101 are provided in the second embodiment, but both of them may be provided. By attaching both of the heating and/or cooling member 64 and the nozzles 100 and 101, the function of heating the wafer W peripheral portion to increase the temperature of the resist solution to thereby decrease the surface tension can be combined with the function of directly applying a solvent to the wafer W peripheral portion to decrease the surface tension of the resist solution applied thereafter, thus making it possible to prevent the aforesaid swelling of the resist solution occurring at the wafer W peripheral portion more efficiently.

Further, in the embodiments described thus far, a so-called single stroke method in which the nozzle 76 for supplying the resist solution and the wafer W are relatively moved to perform coating is explained, but the present invention can be applied to the other coating methods, such as a so-called spin coating method in which the resist solution is applied while the wafer W is rotated, and the like.

Figure 16:
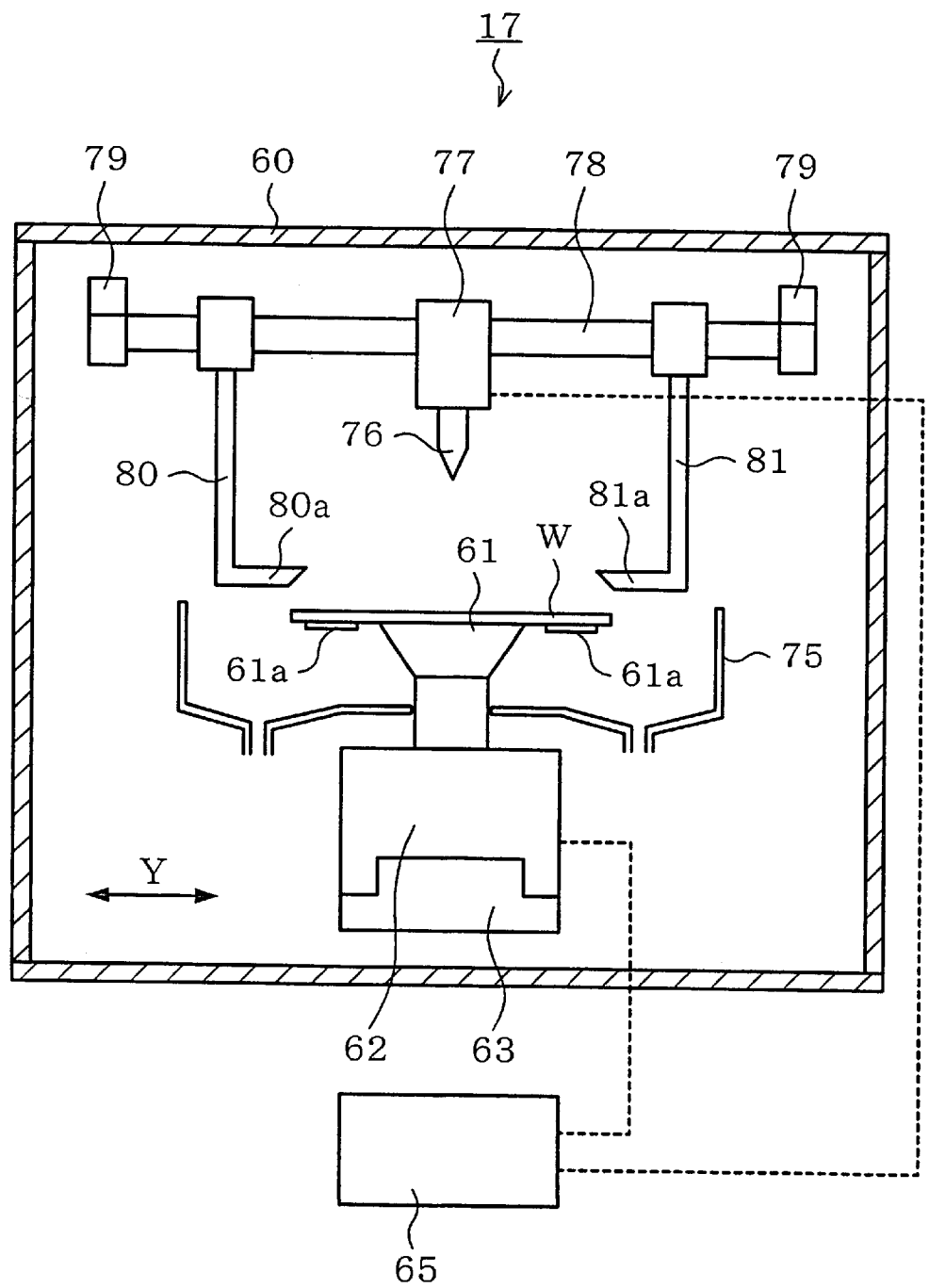
FIG. 16 is an explanatory view of a vertical cross section of the resist coating unit equipped with the heating and/or cooling member at a mounting table.

Furthermore, as shown in FIG. 16, a heating and/or cooling member 61a may be directly attached at an underside surface of the mounting table 61. In this case, the mounting table 61 is previously cooled to the temperature of 10° C. to 15° C. by the heating and/or cooling member 61a. Thereby, the wafer W on the mounting table 61 is also cooled. The resist solution discharged onto the wafer W from the nozzle 76 is reduced in viscosity. Accordingly, the resist solution discharged onto the wafer W does not immediately spread around more than necessary. Thus, the situation in which the streak of the resist solution applied in the manner of a single stroke spreads to the adjacent area and two coatings are applied partially can be prevented from arising.

Further, in the embodiments explained so far, the resist film forming unit for a wafer in the photolithography process in semiconductor device fabrication is described, but the present invention is also applicable to a film forming unit for substrates other than a semiconductor wafer, for example, an LCD substrate.

According to the present invention, by changing the temperature of the perimeter portion of a substrate, the temperature of a coating solution applied onto the substrate can be changed. Accordingly, the surface tension of the coating solution decrease or increases, swelling of the coating solution or reduction in the film thickness occurring at the substrate perimeter portion is prevented, whereby a coating film with a predetermined film thickness is also formed at the perimeter portion of the substrate, thus enhancing yield. By forming the shape of the heating and/or cooling member correspondingly to the shape of the perimeter portion of the substrate, only the temperature of the perimeter portion of the substrate at which change in the film thickness caused by the surface tension is feared can be changed, thus forming a coating film at a predetermined temperature without exerting thermal influence on the coating solution of the other portions. According to the present invention, since the timing of changing the temperature of the perimeter portion of a substrate can be regulated, heating time can be regulated. According to the present invention, when the extent of the swelling of the coating solution occurring at the perimeter portion of the substrate differs according to the regions of the substrate perimeter portion, the temperature for each region can be individually regulated to thereby change the surface tension. By dividing the heating and/or cooling member for heating the perimeter portion of the substrate into circular arc shapes, the temperatures of the regions can be increased gradually in the order of coating, whereby a predetermined coating film is formed over the entire area of the substrate perimeter portion, thus enhancing yield. The heat of the heating and/or cooling member is prevented from being transmitted toward the center of the substrate.

If mist or vapor of a solvent is supplied to the perimeter portion of a substrate to decrease the surface tension of a coating solution applied to the perimeter portion of the substrate, swelling of the coating solution caused by the surface tension at the perimeter portion of the substrate, which is feared, is prevented.

What is claimed is:

1. A film forming unit for applying a coating solution to a substrate and forming a coating film on the substrate, comprising:

a heating and/or cooling member brought into direct or indirect contact with said substrate for changing temperature of at least a peripheral portion of said substrate, and a coating solution discharge portion moving relatively to said substrate and discharging the coating solution to said substrate, wherein said coating solution discharge portion is movable back and forth in a direction relatively to said substrate while discharging the coating solution to a top surface of said substrate, and said substrate is movable in another direction orthogonal to said direction relatively to said coating solution discharge portion wherein said coating solution discharge portion is stopped temporarily at an end for turn, and the coating solution discharge portion is continuously discharging the coating solution to the substrate while the coating solution discharge portion is moving and is stopped temporarily at the end to turn, said heating and/or cooling member is formed into a ring shape corresponding to a shape of a perimeter portion of said substrate, said ring shape is divided into a plurality of divided regions, and said heating and/or cooling member is structured so that a temperature for each said divided region is controllable.

2. A unit according to claim 1, wherein said heating and/or cooling member has a temperature changing element for controlling said heating and/or cooling member at a predetermined temperature.

3. A unit according to claim 1, wherein said heating and/or cooling member is provided at a mounting table on which the substrate is placed.

4. A unit according to claim 3, wherein a cooling member for reducing a temperature of said substrate is provided inside of an inner diameter of said heating and/or cooling member.

5. A unit according to claim 4, wherein a heating member for heating said substrate is further provided inside of an inner diameter of said cooling member.

6. A unit according to claim 1, wherein said heating and/or cooling member is allowed to be in contact with an underside surface of said substrate.

7. A unit according to claim 6, wherein said heating and/or cooling member is vertically movable.

8. A unit according to claim 6, wherein said heating and/or cooling member has contacting member thereon which exist between said heating and/or cooling member and said substrate when said heating and/or cooling member is brought into contact with said substrate.

9. A unit according to claim 1, wherein a heating and/or cooling member is in circular form in a plan view, and has regions divided into circular arc form, and the temperature for each said divided region is controlled while the coating solution discharge portion is discharging the coating solution to the substrate.

10. A film forming unit for applying a coating solution to a substrate and forming a coating film on the substrate, comprising:

a coating solution discharge portion moving relatively to said substrate and discharging the coating solution to said substrate, and a pair of solvent supply devices for supplying mist or vapor of a solvent for said coating solution onto a surface of at least a perimeter portion of said substrate before the coating solution being discharged onto the surface of the substrate, each solvent supply device of said pair of solvent supply devices being disposed at opposite side with respect to the substrate, wherein said coating solution discharge portion is movable back and forth in a direction relatively to said substrate while discharging the coating solution to a top surface of said substrate, and said substrate is movable in another direction orthogonal to said direction relatively to said coating solution discharge portion wherein said coating solution discharge portion is stopped temporarily at an end for turn.

11. A unit according to claim 10, wherein a pair of mask members for preventing the coating solution applied to said substrate from being applied to an outside of the substrate is provided above the perimeter portion of said substrate, the pair of mask members being moved so that the pair of mask members are always above both end portions of the substrate.

* * * * *